United States Patent
Saotome et al.

(10) Patent No.: US 6,727,532 B2
(45) Date of Patent: Apr. 27, 2004

(54) SEMICONDUCTOR INTEGRATED CIRCUIT DEVICE

(75) Inventors: Takao Saotome, Tokorozawa (JP); Takeshi Suzuki, Tachikawa (JP); Hiroyuki Tanaka, Fussa (JP); Shigeru Nakahara, Musashimurayama (JP); Keiichi Higeta, Hamura (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 18 days.

(21) Appl. No.: 10/177,044

(22) Filed: Jun. 24, 2002

(65) Prior Publication Data

US 2003/0030073 A1 Feb. 13, 2003

(30) Foreign Application Priority Data

Aug. 9, 2001 (JP) .......................... 2001-242856

(51) Int. Cl.[7] ............................. H01L 27/10
(52) U.S. Cl. .................. 257/211; 257/210; 257/208; 257/207; 257/202; 365/230.03; 365/189.08; 365/63; 365/230.01
(58) Field of Search ................ 257/211, 210, 257/267, 268, 202; 365/230.03, 189.08, 63, 230.01, 230.02

(56) References Cited

U.S. PATENT DOCUMENTS

| 5,091,883 | A | * | 2/1992 | Matsuzaki et al. | 365/189.05 |
|---|---|---|---|---|---|
| 5,208,782 | A | * | 5/1993 | Sakuta et al. | 365/230.03 |
| 5,323,033 | A | * | 6/1994 | Matsumoto et al. | 257/209 |
| 5,790,839 | A | | 8/1998 | Luk et al. | 395/556 |
| 5,898,636 | A | * | 4/1999 | Isomura et al. | 365/230.03 |
| 6,034,912 | A | | 3/2000 | Isomura et al. | 365/230.03 |
| 6,191,990 | B1 | * | 2/2001 | Itoh et al. | 365/208 |

FOREIGN PATENT DOCUMENTS

| JP | 03116868 A | * | 5/1991 |
|---|---|---|---|
| JP | 7-78874 | | 6/1993 |
| JP | 10-189889 | | 12/1997 |

* cited by examiner

*Primary Examiner*—Nathan J. Flynn
*Assistant Examiner*—Remmon R. Fordé
(74) *Attorney, Agent, or Firm*—Reed Smith LLP; Stanley P. Fisher, Esq.; Juan Carlos A. Marquez, Esq.

(57) ABSTRACT

There is provided a semiconductor integrated circuit device which has realized high speed operation, high integration density and highly efficient layout of the RAM macro, in which a memory array which is divided into four sections in the X and Y coordinates directions is disposed, a first input circuit for receiving a signal which requires optimization for a signal delay is disposed to the center of such four memory arrays, a second input circuit for receiving a data input and control signals thereof is disposed to the center of Y coordinate corresponding to the extending direction of the word line and a signal line for transferring an input signal from the external circuit of the RAM macro to the first and second input circuits is formed using an upper layer wiring for the wiring to form the memory array.

10 Claims, 8 Drawing Sheets

SEMICONDUCTOR INTEGRATED CIRCUIT DEVICE

BACKGROUND OF THE INVENTION

The present invention relates to a semiconductor integrated circuit device and more particularly to a technique which may be effectively adapted to a large scale integrated circuit device comprising RAM macros for high speed operations.

An example of the large scale integrated circuit installing the RAM macros is described in the Japanese Unexamined Patent Application Publication No. Hei 7(1995)-78874 (corresponding U.S. Pat. Nos. 5,898,636 and 6,034,912). This publication proposes a technique to enable high speed and highly efficient circuit design and layout design by replacing a gate array, RAM macro or logic macro in unit of the area to which the clock is supplied from a clock distribution circuit of the final stage for inputting a clock signal from the center area of a semiconductor chip and distribution of clock in the equal distance. An example of a semiconductor integrated circuit device simultaneously loading the DRAM macro and logic core is described in the Japanese Unexamined Patent Application Publication No. Hei 10(1998)-189889 (corresponding U.S. Pat. No. 5, 790, 839). This application publication proposes a structure that the synchronous DRAM (hereinafter referred to as SDRAM) is disposed in the upper and lower areas of a semiconductor chip, a logic core is then disposed between the upper and lower SDRAMs of the chip center area, a PLL is then located in the single side of the chip center area and a clock generated therefrom is guided to the center area of the chip to drive each SDRAM macro and logic core after the buffering.

SUMMARY OF THE INVENTION

In response to the requirement for high integration density and high speed operation of the elements provided within an LSI in recent years, high speed operation is also required even for the RAM macros loaded in an LSI. In the prior art device explained above, any particular consideration is never taken for high speed operation within the RAM macro itself and data is inputted or outputted from the end terminals thereof. As explained above, with high density integration of elements, it is also possible that a RAM macro has a comparatively large storage capacity. Therefore, when data is inputted to or outputted from the end terminals of the RAM macro, the operation rate is controlled and thereby the high speed operation is prevented due to an access time to a memory cell disposed in the furthest position. Accordingly, the inventors of the present invention propose a semiconductor integrated circuit device provided with a RAM macro which classifies the signals for accessing the RAM macros depending on circuit operation and function and shares such access signals in the optimum manner to assure high speed operation.

It is therefore an object of the present invention to provide a semiconductor integrated circuit device which has realized high speed operation of RAM macro and high integration density. The aforementioned and the other objects and novel characteristics of the present invention will become apparent from description of the present specification and the accompanying drawings thereof.

Typical inventions disclosed in this specification will be explained below briefly. A memory array which is divided into four sections in the X and Y coordinates directions is disposed, a first input circuit is disposed to receive a signal required for optimization of signal delay at the center of such four memory arrays, a second input circuit to receive a data input and a control signal thereof is disposed at the center of the Y coordinate corresponding to the extending direction of the word line, an input/output circuit corresponding to a signal other than the signal including a data output is disposed to the end part of the Y coordinate corresponding to the extending direction of data line and an upper layer wiring is used for the wiring forming a memory array as the signal wire to transfer an input signal to the first and second input circuits from an external side of the RAM macro.

DETAILED DESCRIPTION OF THE PREFERRED EMBODIMENTS

Figure 1:
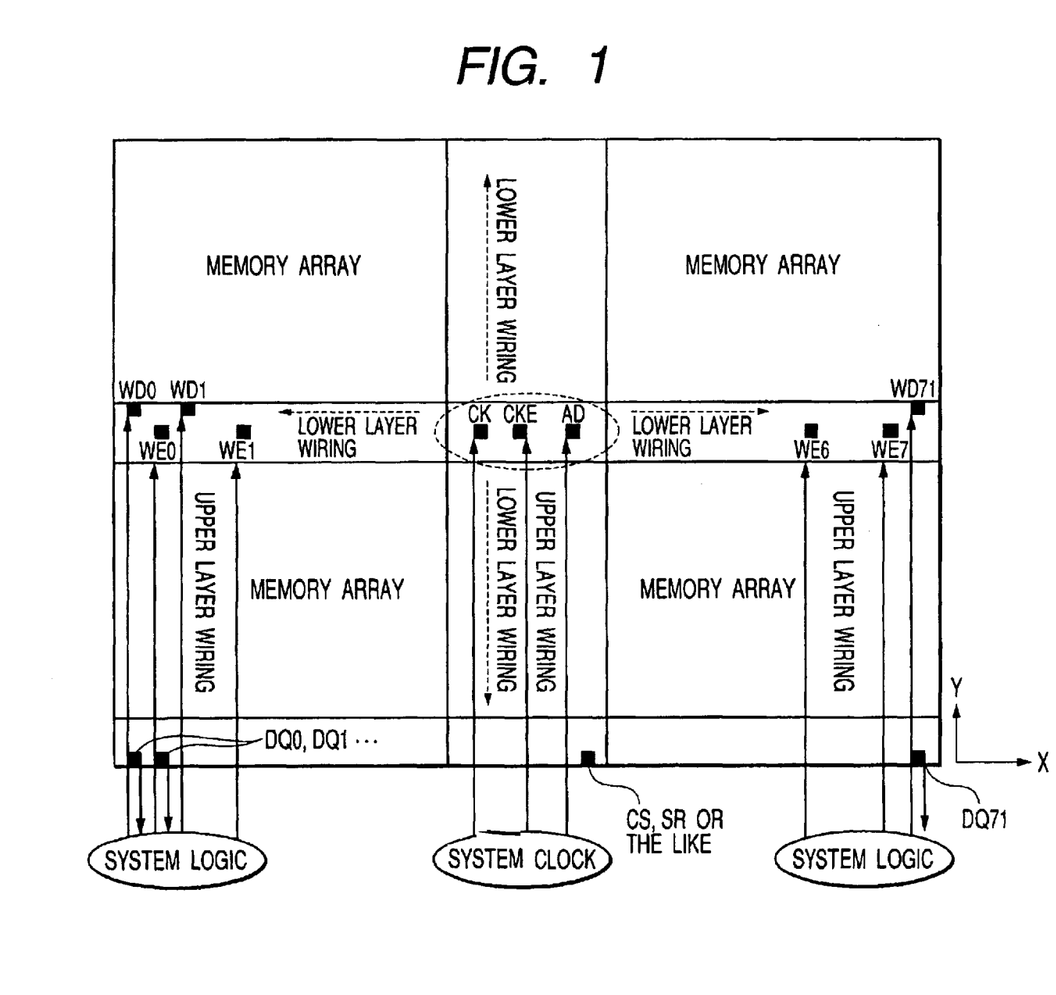
FIG. 1 is a schematic block diagram showing an embodiment of a RAM macro loaded to a semiconductor integrated circuit device of the present invention.

FIG. 1 is a schematic block diagram of an embodiment of a RAM macro loaded to a semiconductor integrated circuit device of the present invention. The RAM macro of this embodiment has a structure that a memory array is divided into four sections with two sections provided respectively in the vertical direction and horizontal direction. With reference to the direction of letters of "MEMORY ARRAY" on the drawing, a memory array selection circuit and peripheral circuits for data input/output are disposed between the memory arrays divided in the vertical direction and between the memory arrays divided in the horizontal direction.

In the RAM macro of this embodiment, a clock for accessing RAM, an address signal, a control signal and signals of data input and data output are classified into three signals depending on the circuit operation and functions and moreover these signals are shared with the optimum method in order to realize high speed operation.

An input circuit for a clock CK, a clock enable signal CKE and an address signal AD is disposed at the center area of the four memory arrays, namely at the cross area where a circuit area for dividing the memory area in the vertical direction and a circuit area for dividing the memory area in the horizontal direction are crossing with each other. Namely, an input terminal of the signal distributed to the entire part of the RAM macro is provided at the center area of such RAM macro, considering delay of the signal such as the clock. The signal may be transferred even to the furthest circuit in the distance only a half of the size of RAM macro by providing the input terminal to such center area.

An address signal for X direction (including a predecode signal) for selecting a word line among the address signals AD inputted from the cross area is extended in the vertical direction with a lower layer wiring and is then guided to a word driver for selecting the word line extended in the horizontal direction (X coordinate) of the memory array. The word driver selects the word line of the memory arrays divided in the horizontal direction explained above. Thereby, the substantial length of word line is set to a half of the length when the RAM macro is formed of only one memory array and thereby the furthest memory array from the word driver can also be selected at a high speed.

In the memory array, a data line (or bit line) is extended in the vertical direction (Y coordinate). With vertical division of the memory array, the length of data line can also be set to a half of the length when the RAM macro is formed of only one memory array. Therefore, the furthest memory cell from a write driver WD to form a write signal to the memory cell can also transfer a signal at a high speed.

An input terminal for receiving the write signal WD and an input terminal for receiving the write enable signal WE are disposed to the center area in the extending direction (Y coordinate) of the data line of the memory array, namely at the center area for dividing the memory area into the upper and lower memory arrays, considering the signal input to the data line of the memory array. In this embodiment, although not particularly restricted, data write is totally carried out in unit of 72 bits and these 72 bits are divided to eight sets, each set is composed of 9 bits and each set is assigned with the write enable signal WE0 to WE7. Therefore, the data of 9 bits can be written (so-called the block write) respectively by designating the desired set among the eight sets explained above. On the contrary, data write can be updated for the desired sets, each set is formed of 9 bits, among the data of 72 bits and the write mask is attached to the data which is not required to be updated.

Meanwhile, the data output circuits DQ0 to DQ71 for outputting a read signal are provided at the lower end part of the memory array. Moreover, an input/output circuit or the like for DC operation in which a signal delay does not give any influence on the memory access, control signal such as a chip select signal CS or the like, redundant relief although not illustrated in the figure and test is also provided at the lower end part of the memory array. Although not particularly restricted, a data output circuit of the RAM macro of this embodiment is formed as a static circuit which does not require the clock and therefore does not require distribution of the clock. Accordingly, this data output circuit of RAM macro is also provided at the lower end part of the memory array which is the nearest area to the system logic for receiving a read signal.

A connection wiring of memory cells of a memory array and a wiring to form a peripheral circuits such as word line selection circuit, input circuit for receiving a write data WD and a write enable signal WE and column selection circuit or the like are formed of the lower layer wiring. This lower layer wiring is formed in a fine structure. Therefore, this wiring results in a rather lower signal transfer rate but since this wiring itself is rather short, it brings about lesser influence on the rate of circuit operation.

On the other hand, when the input terminal is disposed at the center of the RAM macro as explained above, the wiring extended to the center area from the peripheral area of the RAM macro becomes long and thereby such lower layer wiring results in increase of signal delay. Therefore, even if the signal transfer distance is shortened as explained above, a signal delay time becomes long, losing the high speed characteristic. Accordingly, in this embodiment, as the wiring to be connected to the input terminal provided at the center of the RAM macro, the upper layer wiring which may be laid wider is introduced. However, as explained above, the upper layer wiring is laid with the automatic disposing and wiring method for the chip side.

In the case where the input signal is centralized to the center of RAM macro as in the case of this embodiment, a signal delay explained above increases if a low speed lower layer wiring is used. When the high speed upper layer wiring is used like this embodiment, matching with the chip design using the upper layer wiring must be considered in the prior art. However, the RAM macro of this embodiment defines only the wiring up to the internal elements of macro from the input terminal. The wiring up to the input terminal of the RAM macro including the upper layer wiring from the chip is realized with the automatic disposing and wiring method for the chip side. Therefore, it is no longer required to define a library up to the upper layer in the RAM macro. Namely, it is not required to define an inhibit area for avoiding collision with the automatic disposing and wiring method for the chip side. As explained above, in this embodiment, a degree of freedom for design of chip and RAM macro can be improved to a large extent.

Therefore, the input terminals of only clock (CK) address (AD) and clock enable (CKE) or the like which require the optimum design for delay are disposed at the center of RAM macro, while the input terminals of write data (WD) and write enable (WE) or the like to be distributed to the upper and lower areas of the RAM macro are disposed at the center of Y coordinate. The input terminals for various control signals (CS) of DC operations for which it is not required to consider a signal delay and redundant relief (SR) or the like are disposed at the upper and lower end portions of the RAM macro and these are wired with the lowest layer wiring in the minimum wiring width and minimum interval or with the local inter-connect.

The upper layer wiring up to the center of the RAM macro must be laid in the comparatively longer length but a resistance is rather smaller, RC delay may be reduced and high speed operation may also be expected in comparison with the lower layer wiring. The CK, CKE and AD are centralized for layout at the center of the X coordinate of chip and WE and WE are regularly disposed in the X coordinate direction of chip. Thereby, the chip may be wired with the upper layer wiring, while the RAM macro with the lower layer wiring. As a result, number of processes and design failure may be reduced.

From the point of view of circuit functions, wiring up to the internal side of the RAM macro may be realized only with the lower layer wiring, without use of the upper layer wiring, by providing the terminals for various signals such as CK, CKE, AD, WD, WE, SC and SR or the like to the optimum positions. Accordingly, the extra use of the upper layer wiring by the RAM macro can be eliminated and thereby the number of wiring channels of chip can also be increased.

As explained above, the input terminals for the signals distributed to the entire part of the RAM macro are provided at the center of the RAM macro considering a delay of clock or the like, while the input terminals for WD, WE or the like to be distributed to the upper and lower portions of the RAM macro are disposed in a horizontal line at the center of Y axis. The output terminals are provided at the lower end of the RAM macro. Since the RAM macro is formed to have a comparatively wider occupied area, when such RAM macro is loaded to a semiconductor integrated circuit device, it is disposed along the end portion of the semiconductor chip. Accordingly, a system logic or the like is provided in the rather center area of the semiconductor chip and a signal output length to the system logic can be minimized by providing the output terminal to the lower end of the RAM macro as explained above.

Although not particularly restricted, an output circuit provided to a RAM macro is formed as a static type circuit which does not require the clock. Therefore, it is no longer required for this output circuit to receive distribution of the clock. Thereby, this output circuit does not receive any influence even when the distance of the output circuit from the center area from which the clock is supplied becomes longer. When the output circuit is provided at the lower end of the RAM macro, it is just convenient for the case where an attachment macro such as diagnostic macro and logic macro (comparator, aligner or the like) is disposed to the lower end of the RAM macro.

Figure 2:
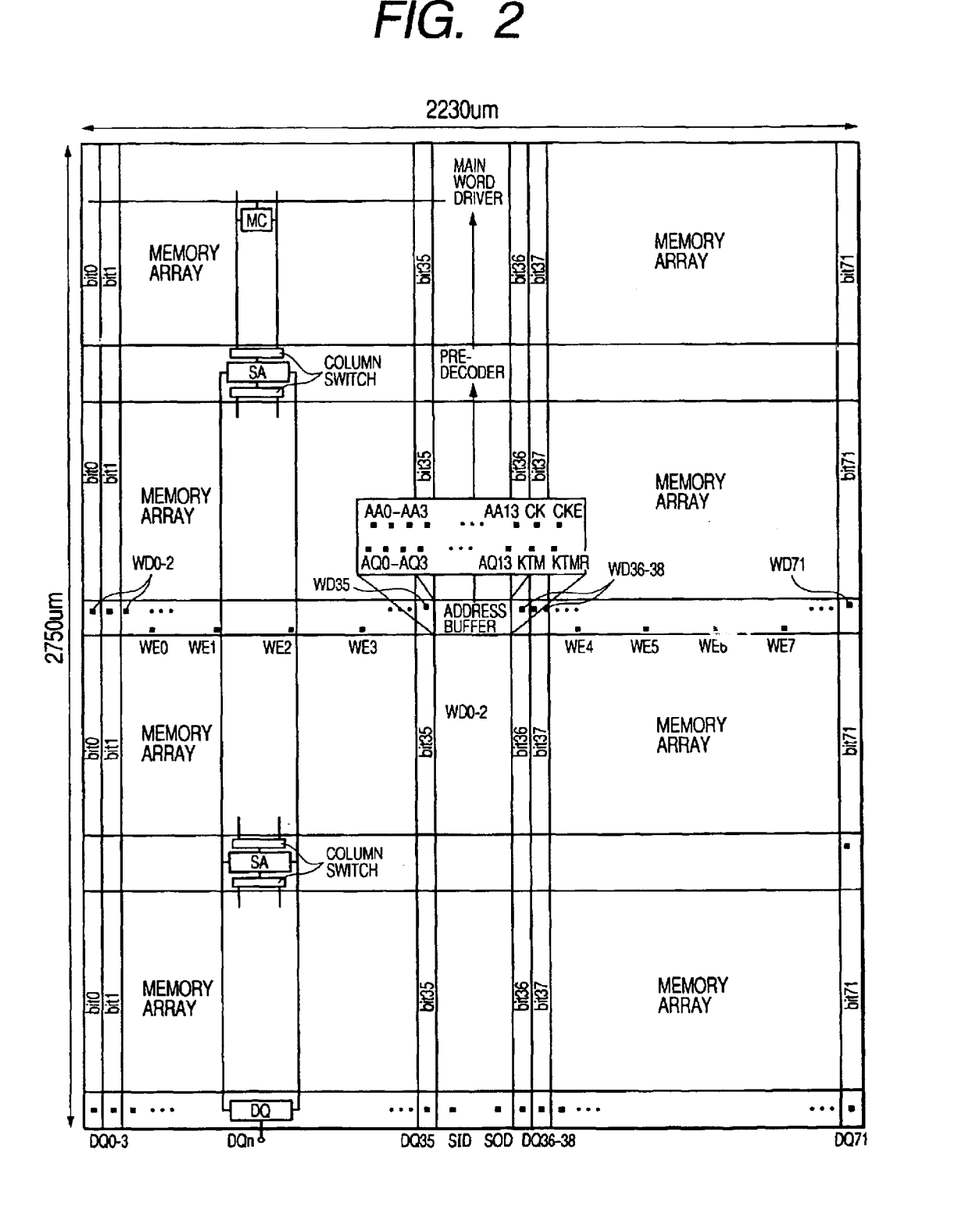
FIG. 2 is a block diagram showing an embodiment of the RAM macro loaded to the semiconductor integrated circuit device of the present invention.

FIG. 2 shows a block diagram of an embodiment of the RAM macro loaded to the semiconductor integrated circuit device of the present invention. Each circuit block forming the RAM macro of this embodiment is shown corresponding to the geometric disposition formed on a semiconductor chip.

A memory array is divided into two sections at the center of the X coordinate (horizontal direction) and a peripheral circuit such as an address buffer and predecoder or the like is provided at the center of the X coordinate. An address signal of X system inputted from the address buffer provided at the center area is guided up to the predecoder provided at the position corresponding to a sense amplifier and a column switch which are explained next and is then transferred to a main word driver to select a word line after it is distributed in the upper and lower portions.

A memory array is also divided into two sections at the center of the Y coordinate (vertical direction) and the input terminals for write data WD and write enable signal WE and the related circuit are provided at the center of Y coordinate. The memory array divided vertically to the upper and lower sections are further divided respectively to the upper and lower two sections with a column switch and a sense amplifier SA provided at the center of the Y coordinate. Thereby, the memory arrays of this embodiment are virtually divided into eight sections, two sections in the horizontal direction, while four sections in the vertical direction.

In each memory array, the word line is extended in the direction of X coordinate, a complementary data line (or bit line) is extended in the direction of Y coordinate and a memory cell MC is provided at an intersection of these word line and complementary data line. Each memory cell is formed of a static type memory cell. In the same figure, a memory cell MC is illustrated as a representative one in one memory array among the memory array which is divided into eight sections as explained above. A word line of any one of memory arrays divided in the vertical direction about a sense amplifier SA is selected and the corresponding complementary data line is also selected with a column switch and is then amplified with the sense amplifier.

Any one of the upper and lower word lines is selected in the memory array which is vertically divided with the input terminals for the write data WD and write enable signal WE provided at the center of the Y coordinate and the related circuit thereof. Namely, the word line is selected in any one of the memory arrays divided into four sections. Therefore, output nodes of the sense amplifier to which the same Y system address is assigned are connected in common to the output lines extended in the direction of the Y coordinate and are then guided to the data output circuit DQ provided at the lower end part of the memory array.

The sense amplifier SA, although not particularly restricted, does not form a CMOS signal level of the full amplitude like a power source voltage and a ground potential of a circuit, but a signal of the amplitude (small amplitude) lower than such CMOS signal to transfer to the data output circuit DQ through the output line explained above. Thereby, the signal may be transferred at a high speed through the output line having comparatively large parasitic capacitance in the comparatively longer wiring length. Moreover, noise in the internal wiring of the RAM macro which is coupled with the output line through the parasitic capacitance can substantially be neglected.

For the data input and data output of 72 bits to and from the memory array, 36 data terminals are assigned in the direction of the X coordinate of memory array corresponding to the division of the memory array explained above, namely the 72 data input WD and data output DQ terminals in total are assigned along the direction of X coordinate at the lower end part of the memory array. Although not particularly restricted, in the area corresponding to the address buffer or the like at the center of the lower end, various control signals or the like of DC operation in which a delay is not particularly considered are also provided in such a manner as representing the input terminal SID and output terminal SOD or the like for the test.

Since there is no difference in wiring length due to the disposition where the RAM macro is mirror-inverted about the X axis and Y axis symmetrical to the terminal layout of the RAM macro like this embodiment and in the length of upper layer wiring, a degree of freedom of the RAM macro layout can be increased.

Figure 3:
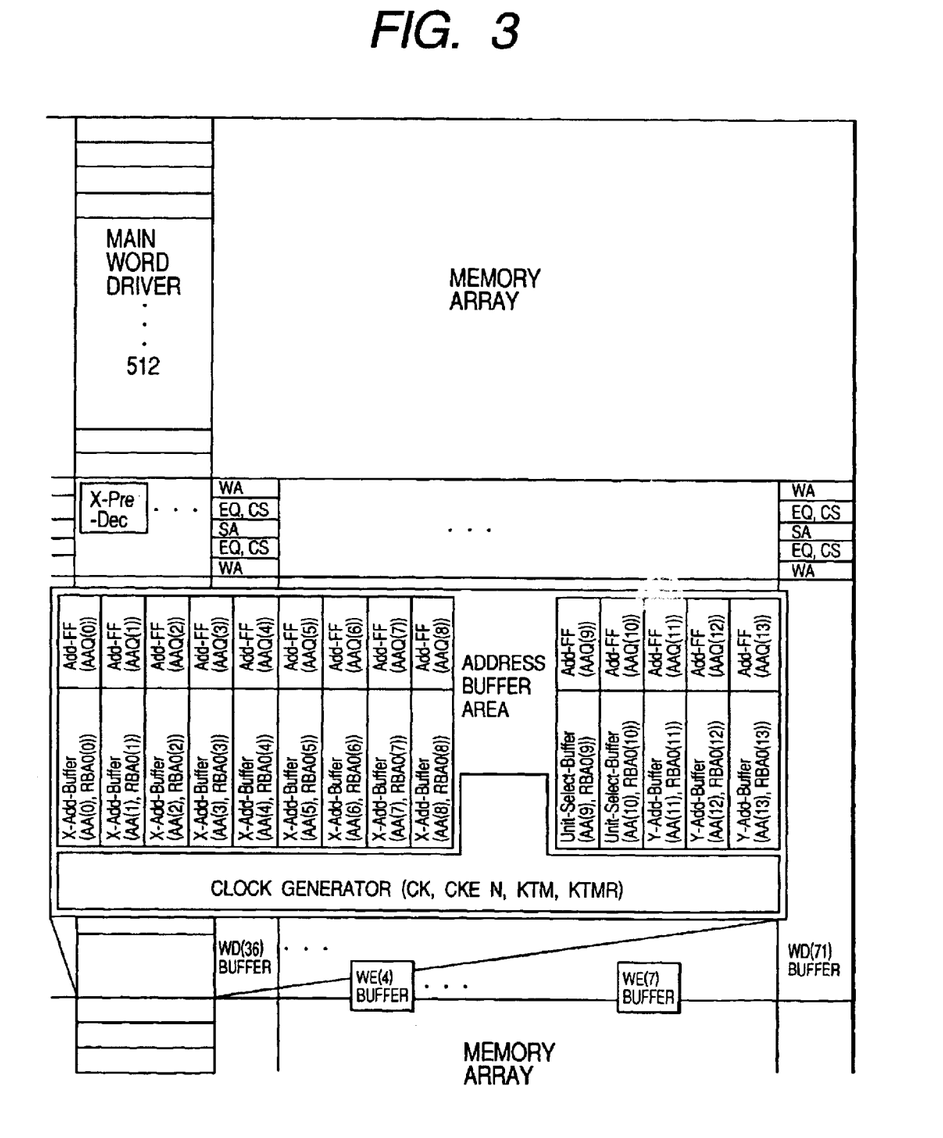
FIG. 3 is a layout diagram showing an embodiment of an address buffer provided at the center of the RAM macro of FIG. 2.

FIG. 3 is a layout diagram showing an embodiment of the address buffer provided at the center area of the RAM macro of FIG. 2. In this figure, one memory array divided into four sections and the peripheral circuit in relation to this memory array are typically illustrated.

The memory array is divided into two sections in the vertical direction with a sense amplifier SA or the like disposed in the direction of X coordinate at the center of Y coordinate. At the center of the X coordinate of the RAM macro corresponding to the area of this sense amplifier SA, a predecoder X-Pre-Dec is arranged. The write amplifier WA, equalize circuit EQ and column switch CS are provided to the sense amplifier SA around only one sense amplifier corresponding to respective memory arrays divided in the vertical directions.

A main word driver is also provided corresponding to the memory array explained above. This main word driver is provided to conduct the operation to select the word line of the memory arrays provided in the right and left directions thereof. This main word driver receives an output signal of the predecoder X-Pre-Dec to select only one word line from one memory array among the memory arrays which is divided into four sections in total in the vertical directions.

The address buffer area and clock generation circuit (clock generator) are provided at the cross area of the center of Y coordinate and the center of X coordinate for dividing the memory array into the four sections. The address buffer selects any one of the 512 main word drivers with the 9 bits of the A0 to A8 for word line selection as the X system address and uses A9 and A10 as the unit selection signal (Unit-Select) for selecting only one memory array among the memory array divided into four sections in the direction of Y coordinate. Moreover, the three bits of the address signals A11 to A13 of Y system are used.

Figure 4:
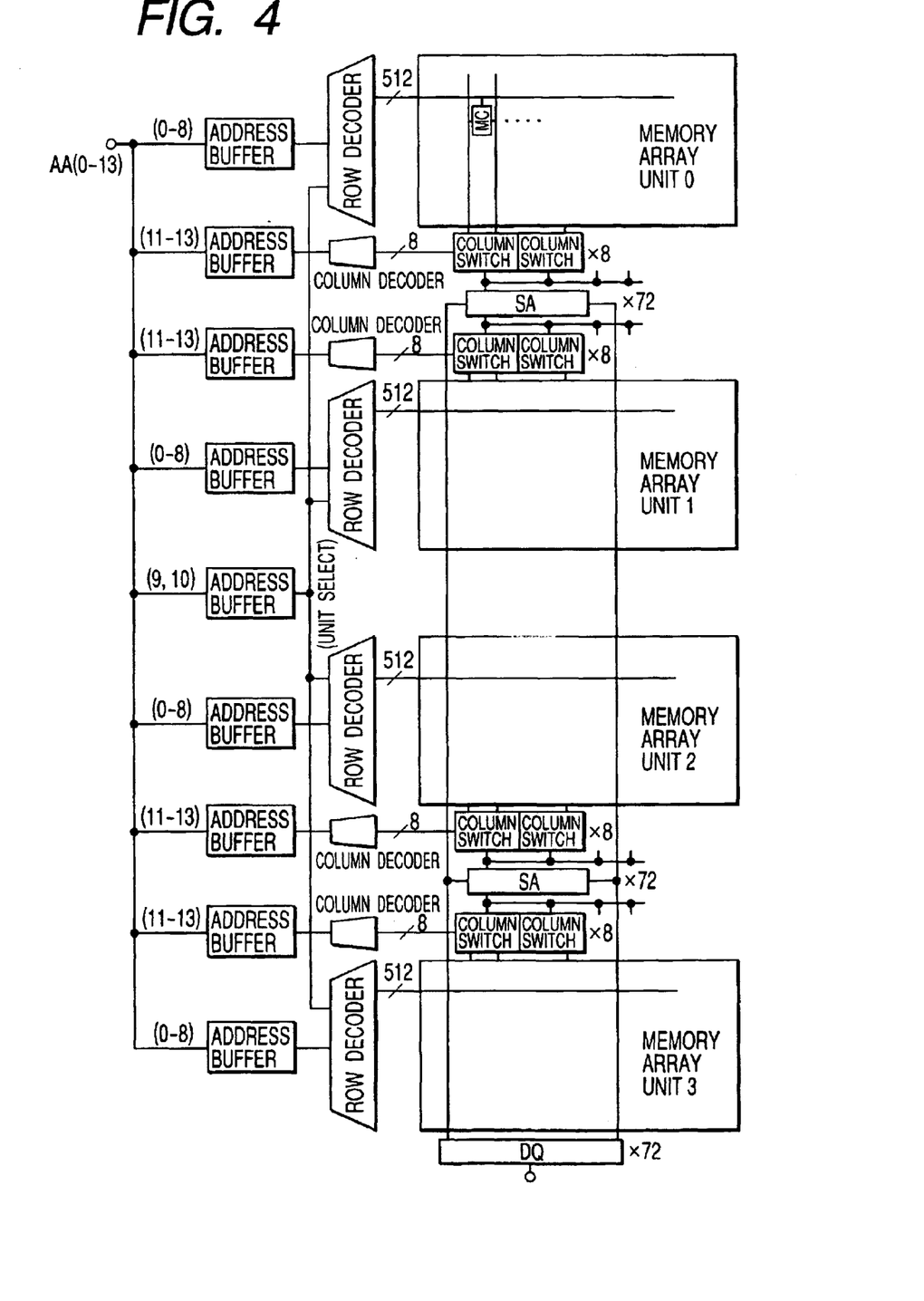
FIG. 4 is a block diagram showing an embodiment of the RAM macro of FIG. 2.

FIG. 4 is a block diagram showing an embodiment corresponding to the RAM macro of FIG. 2. This embodiment shows a circuit of the RAM macro of FIG. 2 and a memory array is formed of four units 0 to 3. These four memory units 0 to 3 correspond to the memory array divided to four sections in the direction of Y coordinate among the total of eight memory arrays illustrated in FIG. 2. Namely, one memory unit is formed of two memory arrays arranged in the right and left directions of the main word driver.

The 512 word lines of the above memory arrays are selected with a decode signal of 9 bits of address signals AA0 to AA8 and a unit select signal formed of the address signals AA9 and AA10. That is, one row decoder selected with the AA9 and AA10 is validated to select one word line with the address signals AA0 to AA8. Three bits of the address signals AA11 to AA13 are decoded with the column decoder to form eight column selection signals. With these column selection signals, a column switch is controlled to select only one pair from the eight pairs of data line of the memory array and then connect the selected data line pair to the sense amplifier SA. Total of 72 sense amplifiers SA are provided for the memory access in unit of 72 bits as explained above.

Accordingly, one memory array (memory unit) has the storage capacity of 467,712 bits (=512×8×72). The RAM macro as a whole is formed of four memory unit and therefore it has the storage capacity of 1,870,848 bits (=467,712×4).

Figure 5:
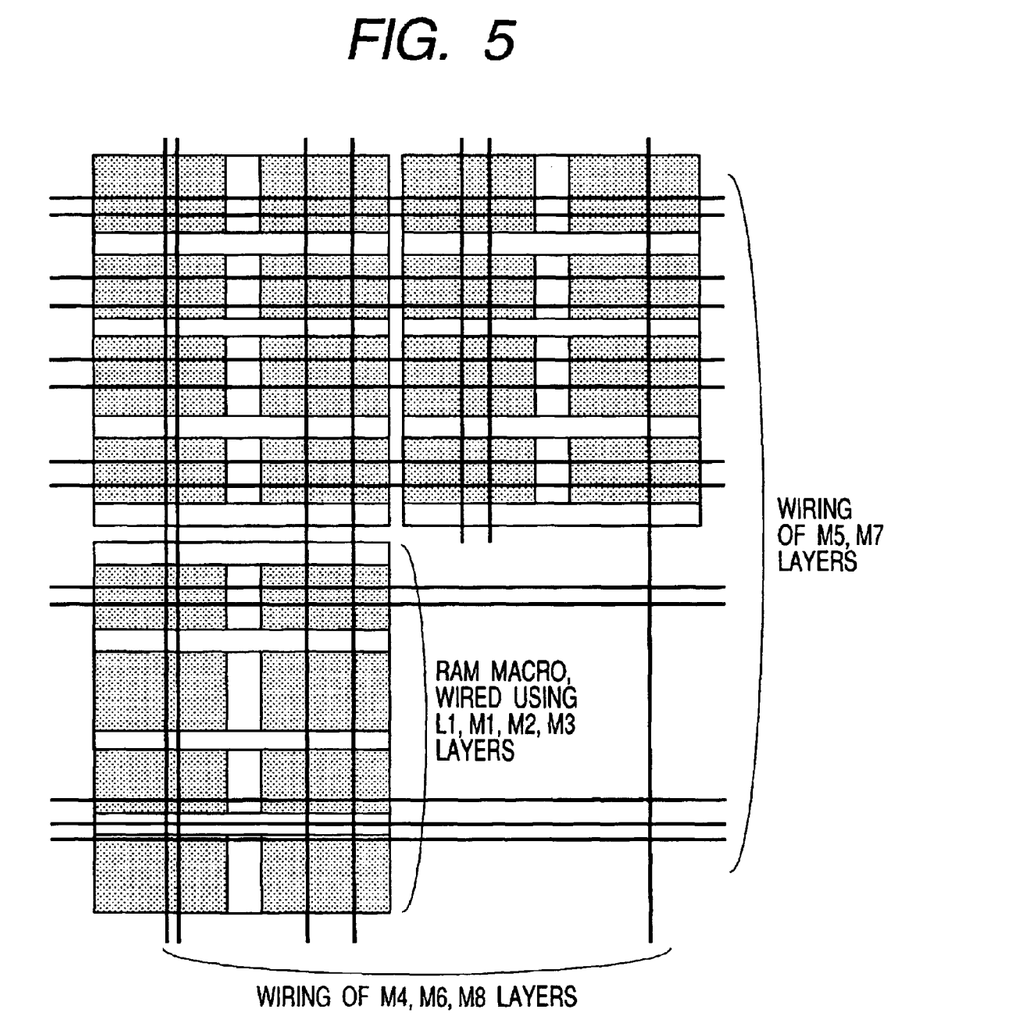
FIG. 5 is a schematic structural diagram showing an embodiment of the RAM macro provided in the semiconductor integrated circuit device of the present invention.

FIG. 5 is a schematic structural diagram showing an embodiment of the RAM macro provided in the semiconductor integrated circuit device of the present invention. In this figure, three RAM macros are typically illustrated.

In the left side half, two RAM macros are disposed symmetrically in the vertical direction. In the lower end of the upper side RAM macro, a data output circuit is disposed and in the upper end of the lower side RAM macro, a data output circuit is disposed. Namely, two RAM macros are disposed symmetrically in the vertical direction with one ends where the data output circuits of RAM macro are provided located adjacently with each other. With such symmetrical layout in the vertical direction, the lower side RAM macro is disposed in the manner that the upper side of the RAM macro in the embodiment of FIG. 2 is located in the lower side.

In the right side half of the same figure, only one RAM macro is disposed. This RAM macro is disposed in parallel to the RAM macro disposed in the upper side of the left side. This layout may be made in the same direction or may be disposed symmetrically in the horizontal direction. The wiring to form these RAM macros is formed of a local wiring L1 such as tungsten and first to third layer metal wirings M1 to M3 formed as the upper layer wiring of such local wiring L1. When the second layer metal wiring M2 cannot be used for the address signal supplied to the center area of the RAM macro and the signal to supply the write signal to be written to the center area of the Y coordinate of the RAM macro, the wirings M4 to M8 are used. When these wirings are used, the inhibit area must be defined for the wirings in the system side.

As the upper layer wiring of the RAM macro formed, the wiring layers M4, M5 and M8 are formed in the direction of Y coordinate, while the wiring layers M5 and M7 in the direction of X coordinate. These wiring layers M4 to M8 correspond to the fourth layer metal wiring to eighth layer metal wiring. A material of these metal wirings M1 to M8 is formed of aluminum or mainly formed of aluminum, although not particularly restricted.

Figure 6:
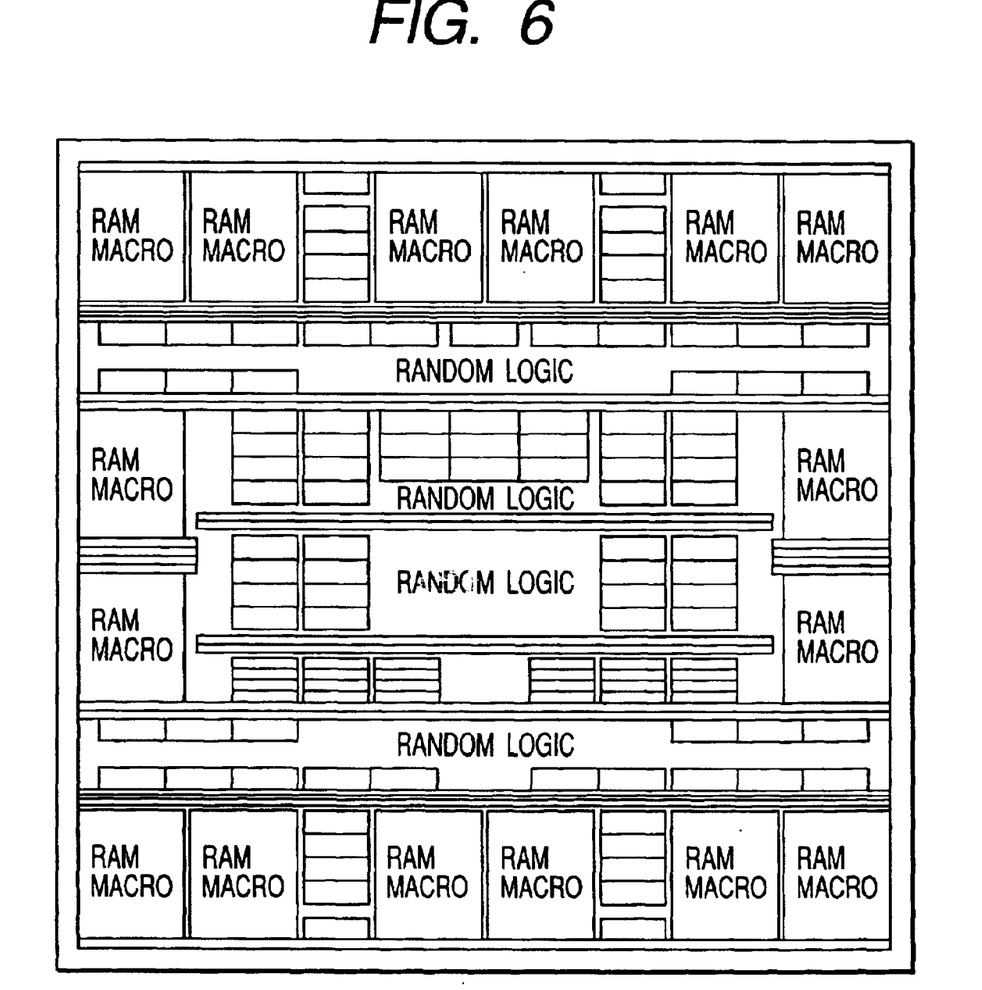
FIG. 6 is a layout diagram showing an embodiment of the semiconductor integrated circuit device of the present invention.

FIG. 6 is a layout diagram showing an embodiment of the semiconductor integrated circuit device of the present invention. The semiconductor integrated circuit device of this embodiment is formed of a RAM macro, a random logic and a combination of the exclusive macros other than the RAM macro. The exclusive macro has a particular circuit function such as an arithmetic circuit or a register or the like and the random logic is formed, although not particularly restricted, of a gate array.

Since the RAM macro requires a comparatively large occupation area, this macro is disposed along the end part of the semiconductor chip. Therefore, if the data output circuit is disposed at the lower end part of the RAM macro as explained above, the part where the data output circuit is provided is not located at the end part of the semiconductor chip. For example, when the data output circuit is disposed at the upper end part of the semiconductor chip, the lower end part of the area where the data output circuit is provided is disposed toward the center area of chip. Meanwhile, when the data output circuit is disposed at the lower end part of the semiconductor chip, the part where the data output circuit is disposed is disposed toward the center area of the chip, through inversion of the direction.

In the case where one memory circuit is formed through combination of two RAM macros, although not particularly restricted, the data output circuits are symmetrically disposed in the vertical direction, in the case where these circuits are arranged in the vertical direction, with the parts thereof provided opposed with each other as explained above. On the other hand, when two RAM macros are used independently, the data output circuits are disposed corresponding to the system logics for receiving data output of the RAM macros.

Figure 7:
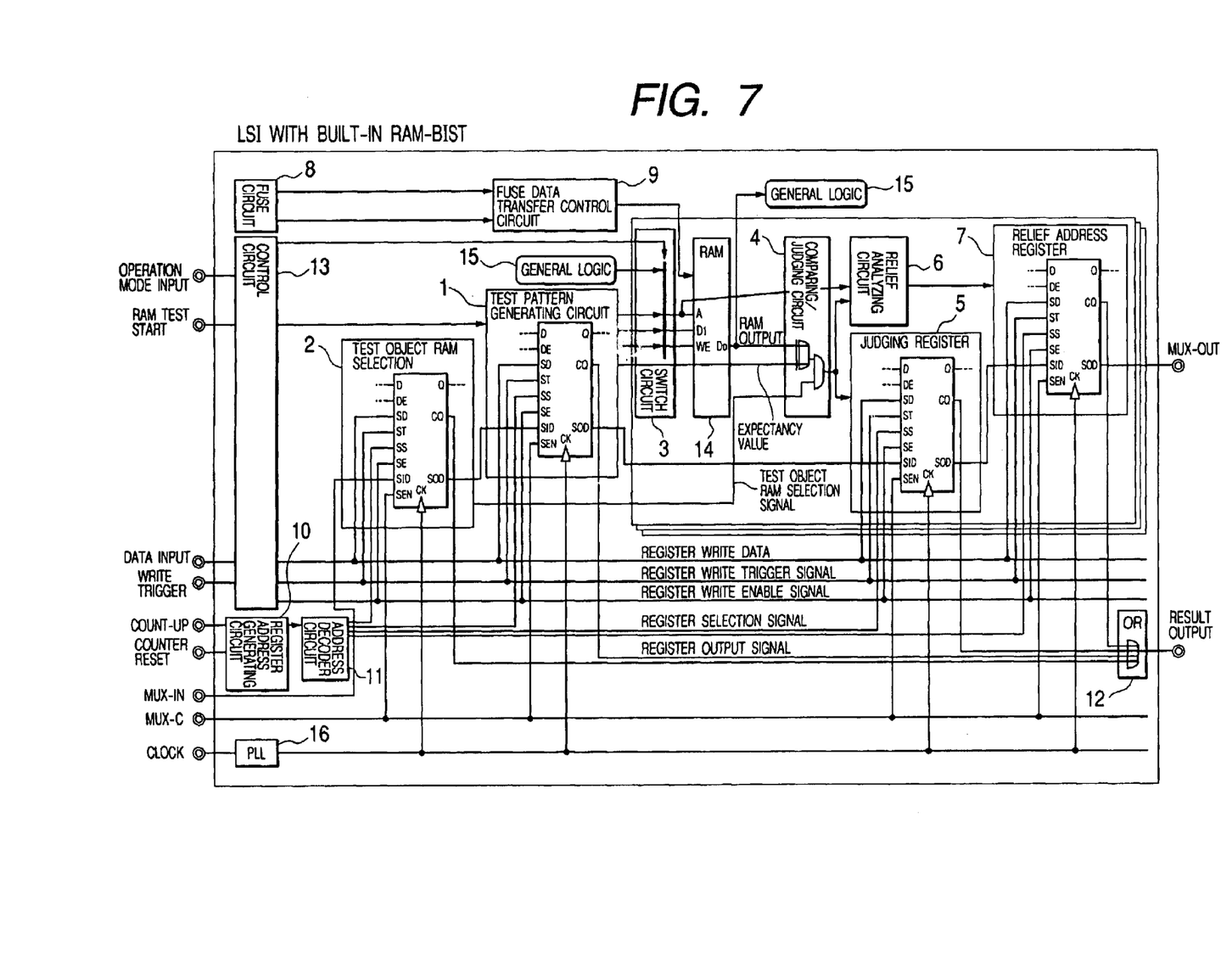
FIG. 7 is a block diagram showing an embodiment of the semiconductor integrated circuit device of the present invention.

FIG. 7 is a block diagram showing an embodiment of the semiconductor integrated circuit device of the present invention. This embodiment is aimed at the semiconductor integrated circuit device built into the RAM-BIST. The semiconductor integrated circuit device of this embodiment is formed of following each circuit block.

Numeral 1 designates a test pattern generating circuit and 2, a test object RAM selection circuit. Namely, when a plurality of RAMs are loaded to one semiconductor integrated circuit device, the test is conducted by sequentially switching a plurality of RAMs designated with the test object RAM selecting circuit using the test pattern generated with the same test pattern generating circuit 1 for each RAM.

Numeral 3 designates a switch circuit for switching the test operation and system operation. Namely, the switch circuit 3 switches the ordinary memory access to the RAM 14 with a signal generated by ordinary logic and the memory access with a test pattern generated in the test pattern generating circuit 1. Numeral 4 designates a judging circuit for comparing a RAM output with an output expectancy value. As the output expectancy value, a value generated by the test pattern generating circuit 1 is transferred. Numeral 5 designates a judging register to store the result of judgement of the judging circuit 4 (result of test).

Numeral 6 designates a relief analyzing circuit to calculate a RAM fault relief method (relief address) with a fuse from a defective RAM address. The relief address calculated with this relief analyzing circuit 6 is stored in a relief address register 7. Numeral 8 designates a fuse circuit for storing a defective address. A fuse data transfer control circuit 9 transfers a defective address data of the fuse circuit to the RAM 14.

Numeral 10 designates a register address generating circuit to generate an address signal of a register forming the test object RAM selection circuit 2, test pattern generating circuit 1, a judging register 5 and a relief address register 7. An address decoder circuit 11 generates a register selection signal by decoding the address signal. Numeral 12 is an OR circuit for obtaining OR of output signals of each register to output a result of the selected register. Numeral 13 designates a control circuit to control operation of each element circuit of the RAM-BIST explained above. The RAM 14 is a memory circuit of test object. A PLL selectively divides the frequency of a clock to form a system clock for testing MUX-SCAN with MUX-IN, MUX-C.

In the RAM-BIST circuit of FIG. 7, although not particularly restricted, the control circuit 13 governs the control of RAM-BIST. The control circuit 13 is controlled with an operation mode selection signal. Sequence of the RAM test with the RAM-BIST circuit of FIG. 7 is as follows.

Here, the operation mode is set to "register set mode". In order to conduct the RAM test with the RAM-BIST circuit, condition (test pattern) is set for the register of the following each circuit. The judging register 5 and relief address register are initialized by setting content of the test pattern generated to the RAM test pattern generating circuit 1, selection of RAM (when a plurality of RAMs are used) to be tested to the test object RAM selection circuit 2 and test operation to the switch circuit 3.

Here, the operation mode is set to "RAM test mode". Thereby, the RAM 14 is accessed with a test pattern generated by the test pattern generating circuit 1. In the embodiment of FIG. 7, a RAM test start trigger signal is generated and the RAM test can be started by inputting the "H" pulse.

The RAM test pattern generating circuit 1 generates a test pattern, the switch circuit 3 selects the test operation and the judging circuit 4 compares a RAM output with an output expectancy value and stores a result of judgment (test result) to the judging register 5. The relief analyzing circuit 6 calculates a defective RAM address relief address and stores the calculated relief address to the relief address register 7. In the "RAM test mode", all circuits operates in the frequency of the clock CK.

The operation mode is set to the "Register collection mode" 4. A result of the RAM test by RAM-BIST can be judged by reading a register value of each circuit. The good/no-good information can be read from the judging register 5 and a relief address can be read from the relief address register 7. Here, the operation mode is then set to the "System operation mode". Corresponding to this setting the switch circuit 3 selects the system operation to start the ordinary system operation.

In the same figure, even in any case where the comparing/judging circuit 4, judging register 5 and relief address register 7, etc. are provided in the RAM macro or in the external side of the RAM macro, it is very convenient for the comparing and judging circuit 4 to compare a RAM output with an expectancy value to provide the data output circuit to one end of the RAM macro (lower end part in the example explained above). Namely, since an expectancy value is formed by the test pattern generating circuit 1, it is naturally provided in the external side of the RAM macro. Therefore, it is convenient that a data output circuit is provided at one end of the RAM macro (lower end part in the example explained above).

Figure 8:
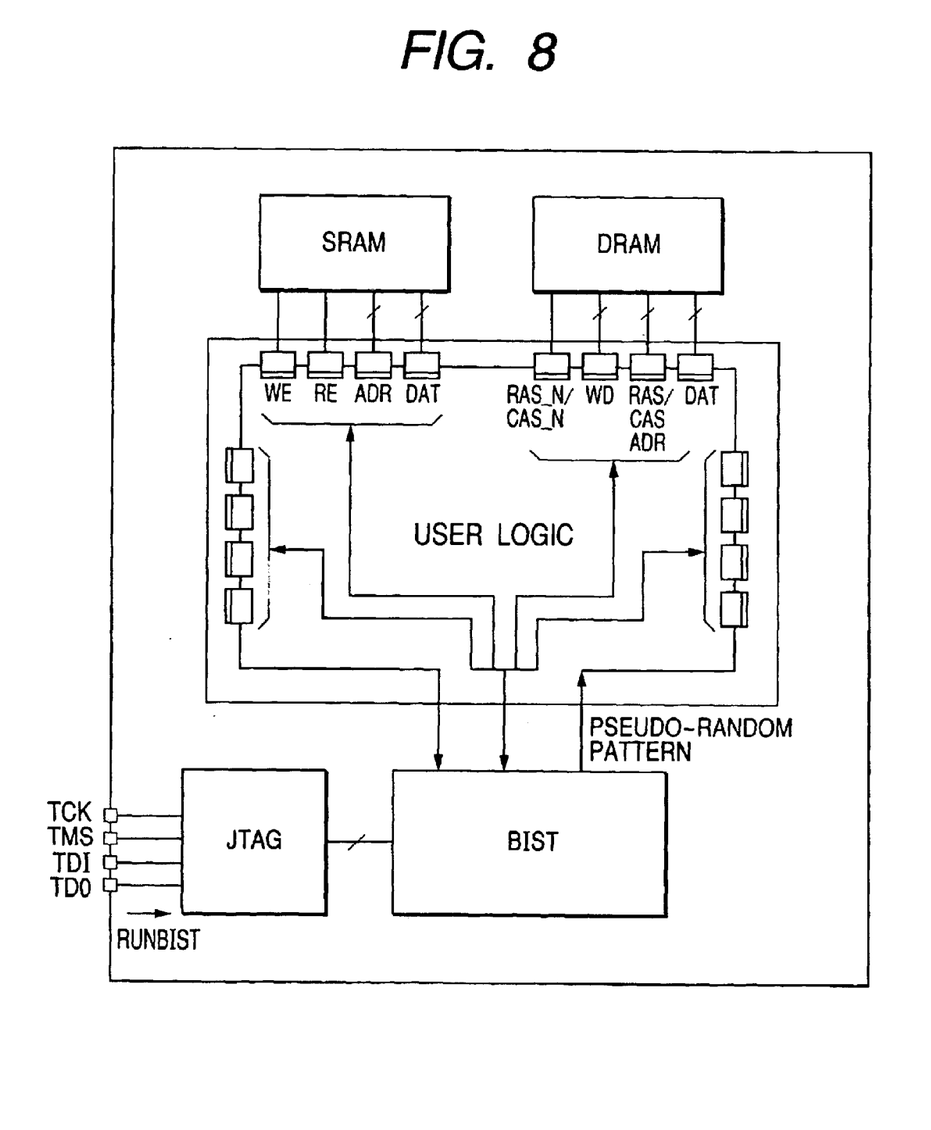
FIG. 8 is a block diagram showing an embodiment of the semiconductor integrated circuit device of the present invention.

FIG. 8 is a block diagram showing another embodiment of the semiconductor integrated circuit device of the present invention. The semiconductor integrated circuit device of this embodiment is composed, although not particularly restricted, of a DRAM (dynamic RAM), an SRAM (static RAM), a user logic for controlling these RAMs, a test circuit BIST and an interface circuit JTAG. The interface circuit JATG is serially capable of inputting and outputting a mode setting signal TMS, test input data TDI and test output data TDO in synchronization with a clock terminal TCK.

The DRAM is provided, although not particularly restricted, with a DRAM core having the storage capacity as large as 64 Kwords×288 bits (about 18.4 Mbits), four registers having the storage capacity of 72 bits for data write to such DRAM core and four registers having the storage capacity of 72 bits for data read therefrom. The SRAM also has a function as a buffer register for input and output operations and is provided, although not particularly restricted, with four ports for data write of 128 words×72 bits and four ports for data read of 128 words×72 bits. The user logic is composed of an input/output interface for inputting and outputting in unit of 72 bits and a multiplexer or the like for transferring data of 72 bits between the SRAM and DRAM.

The test circuit BIST is provided with a MUX-SCAN route which supplies in serial a test pattern to a latch circuit which is chained with the user logic to form a register and controls this latch circuit to transmit in parallel a signal to instruct the operation to the user logic, DRAM and SRAM. Therefore, the DRAM, SRAM and user logic are capable of operating the internal circuits thereof for the judgment with the test pattern supplied from the test circuit BIST depending on the operation mode of the MUX-SCAN as required.

The effects obtained from above embodiments are as follows.

(1) The effect to realize high speed operation, high integration density and effective layout of RAM macro can be realized by disposing a memory array divided into four sections in the X and Y coordinates directions, disposing a first input circuit to receive a signal which requires optimization of a signal delay to the center of such four memory arrays, disposing a second input circuit to input a data and receive a control signal for such data to the center of Y coordinate corresponding to the extending direction of the word line, disposing an input/output circuit corresponding to the signal other than the signal including a data output to the end part of the Y coordinate corresponding to the extending direction of the data line and forming a signal line for transferring an input signal from external side of the RAM macro to the first and second input circuits using an upper layer wiring for the wiring to form the memory array.

(2) In addition to the effect of item (1), the distance to the furthest circuit can be reduced to a half of the size of RAM macro and thereby high speed operation can also be attained by using an address signal, a clock signal used as required and a clock enable signal as the signal which requires the optimization of signal delay and then providing the input terminals of these signals to be distributed to the entire part of the RAM macro at the center of the RAM macro.

(3) In addition to the above effects, data can be read at a high speed from the memory cells and an effective signal output route can be formed with lesser number of wirings through reduction of the number of memory cells connected to the selected data line by dividing, into two sections, the memory arrays divided with the center of the Y coordinate where the second input circuit is provided at the center of the Y coordinate and then providing a column switch and a sense amplifier, connecting in common the output lines of the sense amplifiers to which the same column selection address is applied and then guiding the output lines to the data output circuit.

(4) In addition to the above effects, high speed operation can be attained and a coupling noise to the internal wirings of the RAM macro can be reduced by transferring a low amplitude sense output to the output lines of the sense amplifiers.

(5) In addition to the above effects, the input/output circuit can be formed in the structure which may be effectively applied to the test circuit with inclusion of a circuit corresponding to the input and output signals for test.

(6) In addition to the above effects, the RAM macro having a comparatively large occupation area and the system logic for controlling the RAM macro can be disposed effectively by adjacently disposing any one of the four end parts forming the RAM macro, except for the end part where the input/output circuit is provided.

(7) In addition to the above effects, the comparing and judging circuit for comparing a RAM output with an expectancy value can be disposed effectively by providing an input/output circuit for test corresponding to the end part where the input/output circuit is provided.

(8) In addition to the above effects, the test operation can be conducted easily by further providing the test pattern generating circuit to generate the test pattern supplied to the RAM macro and also generate the expectancy value thereof and including, to the input/output circuit for test, the switch circuit for switching the input of the test pattern and the input of the ordinary operation and the comparing and judging circuit for comparing the output signal read from the RAM macro with the expectancy value.

(9) In addition to the above effects, the semiconductor integrated circuit device including various RAM macros can be tested easily by using a plurality of RAM macros, further comprising a RAM macro selection circuit for designating the test object RAM macros and then conducting the test operation to the RAM macros selected with the RAM macro selection circuit.

The embodiments of the present invention have been explained above but the present invention is not limited to such embodiments and naturally allows various changes and modifications with the scope not departing from the claims thereof described later. For example, an input signal for the RAM macros may be added as required or unwanted input signals may also be deleted. In regard to the divided structure of the memory array of RAM macro, various profiles such as 4-division as explained above or 8-division with sense amplifiers may be introduced. The present invention can be widely utilized for various semiconductor integrated circuit devices including a memory circuit such as logic circuit and RAM macro.

The effects obtained by typical inventions disclosed in this specification can be briefly summarized below.

High speed operation, high integration density and effective layout of the RAM macros can be realized by disposing the 4-divided memory arrays in the X and Y coordinates directions, disposing the first input circuit for receiving the signal which requires optimization of signal delay to the center of four memory arrays, disposing the second input circuit for receiving data input and control signals thereof to the center of the Y coordinate corresponding to the extending direction of the word line, disposing the input/output circuit corresponding to the signal other than the signal including data output to the end part of the Y coordinate corresponding to the extending direction of the data line and forming, with use of the upper layer wiring, the signal line for transferring an input signal from the external side of the RAM macro to the first and second input circuit for the wiring to form the memory array.

What is claimed is:

1. A semiconductor integrated circuit device comprising a RAM macro, including:
    memory arrays divided into four memory arrays in the X and Y coordinates directions;
    a first input circuit provided at the center of said four memory arrays for receiving a first signal; and
    a second input circuit provided between two memory arrays which are disposed side by side in the direction of said Y coordinate among four memory arrays for receiving a second signal,
    wherein a signal line for transferring said first and second signals to said first and second input circuits from the external side of said RAM macro is formed using an upper layer wiring for the wiring to form said memory array, and
    wherein said upper layer wiring is formed in the area to form a system wiring for connecting macros.

2. A semiconductor integrated circuit device according to claim 1, further comprising a data output circuit provided at the end part in the direction of Y coordinate.

3. A semiconductor integrated circuit device according to claim 1, wherein said first signal includes a clock signal and a clock enable signal and said second signal includes a data signal.

4. A semiconductor integrated circuit device according to claim 1, wherein each memory array divided at the center of Y coordinate where said second input circuit is provided includes a column switch and a sense amplifier, and
    wherein an output line of said sense amplifier is connected to a data output circuit.

5. A semiconductor integrated circuit device according to claim 4, wherein a sense output of low amplitude is transferred to the output line of said sense amplifier.

6. A semiconductor integrated circuit device according to claim 3, further comprising a circuit corresponding to an input/output signal for test.

7. A semiconductor integrated circuit device according to claim 2, wherein any one of end parts of said RAM macro is provided adjacently to the end part of a semiconductor chip, except for the end part, where said data output circuit is provided, among four end parts forming said RAM macro.

8. A semiconductor integrated circuit device according to claim 1, further comprising an input/output circuit for test.

9. A semiconductor integrated circuit device according to claim 8, further comprising a test pattern generating circuit for generating a test pattern and an expectancy value thereof to be supplied to said RAM macro,
    wherein said input/output circuit for test includes a switch circuit for switching the input of test pattern and input of ordinary operation and a comparing and judging circuit for comparing an output signal read from said RAM macro with said expectancy value.

10. A semiconductor integrated circuit device according to claim 9,
    wherein said RAM macro is formed of a plurality of macros, and
    wherein said test circuit is further provided with a RAM macro selection circuit for designating test object RAM macros among a plurality of RAM macros to conduct the test operation to the RAM macros selected with said RAM macro selection circuit.

* * * * *